(12) United States Patent
Li et al.

(10) Patent No.: US 11,474,386 B2
(45) Date of Patent: Oct. 18, 2022

(54) THIN-FILM TRANSISTOR, ARRAY SUBSTRATE, DISPLAY PANEL AND DISPLAY DEVICE

(71) Applicant: BOE TECHNOLOGY GROUP CO., LTD., Beijing (CN)

(72) Inventors: Pan Li, Beijing (CN); Hongfei Cheng, Beijing (CN); Yongda Ma, Beijing (CN); Xueguang Hao, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/197,389

(22) Filed: Mar. 10, 2021

(65) Prior Publication Data

US 2021/0200003 A1 Jul. 1, 2021

Related U.S. Application Data

(62) Division of application No. 15/579,480, filed as application No. PCT/CN2017/083043 on May 4, 2017, now abandoned.

(30) Foreign Application Priority Data

May 31, 2016 (CN) .......................... 201620510831.8

(51) Int. Cl.
*G02F 1/1333* (2006.01)
*G02F 1/1368* (2006.01)
(Continued)

(52) U.S. Cl.
CPC .......... *G02F 1/1333* (2013.01); *G02F 1/1368* (2013.01); *H01L 27/12* (2013.01);
(Continued)

(58) Field of Classification Search
CPC ..................................................... G02F 1/1333
See application file for complete search history.

(56) References Cited

U.S. PATENT DOCUMENTS

2003/0205973 A1 11/2003 Park et al.
2007/0126939 A1* 6/2007 Jung ................. H01L 29/41733
349/1
2011/0248266 A1 10/2011 Miyake et al.

FOREIGN PATENT DOCUMENTS

CN 1455631 A 11/2003
CN 1949542 A 4/2007
(Continued)

OTHER PUBLICATIONS

International Search Report and Written Opinion for PCT Application No. PCT/CN2017/083043, dated Jul. 28, 2017.
(Continued)

*Primary Examiner* — Edmond C Lau
(74) *Attorney, Agent, or Firm* — Dinsmore & Shohl LLP

(57) ABSTRACT

Embodiments of the disclosure provide a thin-film transistor, an array substrate, a display panel and a display device. The thin-film transistor includes a current enhancement portion, and the current enhancement portion is provided between a drain and a source. The current enhancement portion may include at least one protrusion portion, and the protrusion portion is provided on the drain and/or the source and faces a channel. The current enhancement portion may include an island portion provided between the drain and the source, and the island portion is separate from the drain and the source. The island portion may include at least one protrusion end, and the at least one protrusion end faces the drain and/or the source.

11 Claims, 10 Drawing Sheets

(51) Int. Cl.
   *H01L 27/12*      (2006.01)
   *H01L 29/786*     (2006.01)
(52) U.S. Cl.
   CPC .... *H01L 27/1222* (2013.01); *H01L 29/78603* (2013.01); *H01L 29/78606* (2013.01); *H01L 29/78696* (2013.01)

(56) References Cited

FOREIGN PATENT DOCUMENTS

| | | | |
|---|---|---|---|
| CN | 101562199 | A | 10/2009 |
| CN | 102918650 | A | 2/2013 |
| CN | 205645823 | U | 10/2016 |
| JP | 2001077346 | A | 3/2001 |

OTHER PUBLICATIONS

Non-Final Office Action dated Nov. 29, 2019, relating to U.S. Appl. No. 15/579,480.
Final Office Action dated Mar. 19, 2020, relating to U.S. Appl. No. 15/579,480.
Non-Final Office Action dated Aug. 20, 2020, relating to U.S. Appl. No. 15/579,480.
Final Office Action dated Dec. 10, 2020, relating to U.S. Appl. No. 15/579,480.

\* cited by examiner

THIN-FILM TRANSISTOR, ARRAY SUBSTRATE, DISPLAY PANEL AND DISPLAY DEVICE

CROSS-REFERENCE TO RELATED APPLICATIONS

The present application is a divisional of U.S. patent application Ser. No. 15/579,480 filed on Dec. 4, 2017 and entitled "THIN-FILM TRANSISTOR, ARRAY SUBSTRATE, DISPLAY PANEL AND DISPLAY DEVICE", which is a U.S. National Stage Entry under 35 U.S.C. § 371 of International Application No. PCT/CN2017/083043, filed on May 4, 2017, which claims priority to and the benefit of Chinese Application No. 201620510831.8 filed on May 31, 2016 and entitled "THIN-FILM TRANSISTOR, ARRAY SUBSTRATE, DISPLAY PANEL AND DISPLAY DEVICE", the disclosure of which is hereby incorporated by reference in its entirety.

TECHNICAL FIELD

The disclosure relates to a thin-film transistor, an array substrate, a display panel and a display device.

BACKGROUND

With progress in technology, a consumer has increasingly higher requirements for a display electronic product. For example: finer images or narrower frames, and the like. Certainly, finer images or narrower frames, and the like, all require smaller circuit components or structural units.

For example, finer images requires smaller pixel units. In a case where the circuit structures of the pixel units are the same, the reduction in the area of the pixel units will cause a reduction in the aperture ratio of the pixels. In this case, in order to guarantee the brightness of the picture unchanged, it is necessary to increase the brightness of the back lighting, thereby causing increase in power consumption of the display panel.

In the related art, an attempt to optimize circuit components or structures in the pixel units has been made, in order to reduce the area of the opaque region and improve the aperture ratio. It is difficult for this method to be effective to the pixel units which have been very small. How to improve the aperture ratio of the pixel on smaller pixel units is a problem which is faced for now and will be faced in the future.

On the other hand, for the anti-electrostatic circuit in the peripheral region of the display panel, it is also necessary to optimize circuit components or structure units to reduce the occupied area and meet the requirement for narrow frames.

SUMMARY

According to a first aspect of the disclosure, there is provided a thin-film transistor comprising a gate, a drain, a source and a channel, which further comprises a current enhancement portion, the current enhancement portion is provided between the drain and the source.

According to a second aspect of the disclosure, there is provided an array substrate, which includes a display region and a non-display region, wherein the display region and/or the non-display region include the thin-film transistor as described above.

According to a third aspect of the disclosure, there is provided a display panel which includes the array substrate as described above.

According to a fourth aspect of the disclosure, there is provided a display device which includes the display panel as described above.

BRIEF DESCRIPTION OF THE DRAWINGS

In order to illustrate the technical solutions of the embodiments of the disclosure more clearly, drawings of the embodiments will be explained briefly below. It should be noted that drawings described below only relate to some embodiments of the disclosure and do not limit the disclosure. Those similar reference signs are used to indicate similar elements throughout the disclosure. In the drawings.

DETAILED DESCRIPTION

In order to make purposes, technical solutions and advantages of the embodiments of the disclosure more clear, a clear and complete description of technical solutions of the embodiments of the disclosure will be given below in conjunction with drawings. Obviously, the embodiments described are a part of the embodiments of the disclosure, but not all of them. Based on the described embodiments of the disclosure, all other embodiments obtained by those skilled in the art without creative labor also fall within the protection scope of the disclosure.

Figure 1:
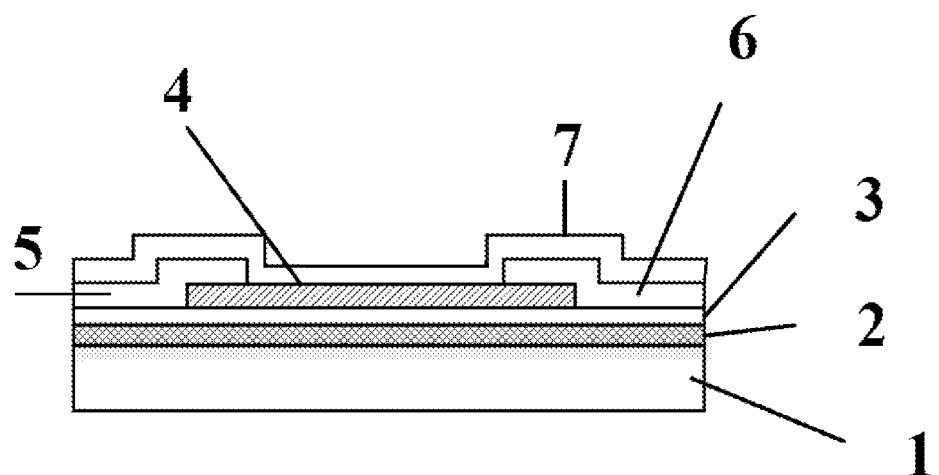
FIG. 1 is a structural diagram of a related thin-film transistor.

FIG. 1 is a structural diagram of a related thin-film transistor. As shown in FIG. 1, the thin-film transistor includes a substrate 1, a gate 2, a gate insulation layer 3, an active layer 4, a drain 5 and a source 6, a passivation layer 7 which are laminated successively. When a voltage is applied to the gate 2 to turn on the transistor, a current flows between the drain 5 and the source 6 via the active layer 4.

If the ability of the current flowing between the drain 5 and the source 6 is enhanced, the same or a higher ON current can be provided while the occupied space of the thin-film transistor is reduced. In this way, when the thin-film transistor is applied in the pixel unit of the display region of the display device, the aperture ratio of the pixel unit can be improved. When the thin-film transistor is applied in a circuit, such as an anti-electrostatic circuit, in the non-display region of the display device, the frame region of the display device can be reduced.

Some embodiments of the disclosure provide a thin-film transistor which includes a current enhancement portion, and the current enhancement portion is provided between the drain 5 and the source 6. The current enhancement portion is used to enhance the current flowing between the drain 5 and the source 6.

In some embodiments, the current enhancement portion may include at least one protrusion portion, and the protrusion portion is provided on the drain and/or the source, and faces the source and/or the drain, i.e., faces a channel between the drain and the source.

Optionally, in order to enhance the current better, the protrusion portion may include a tip.

Figure 2:
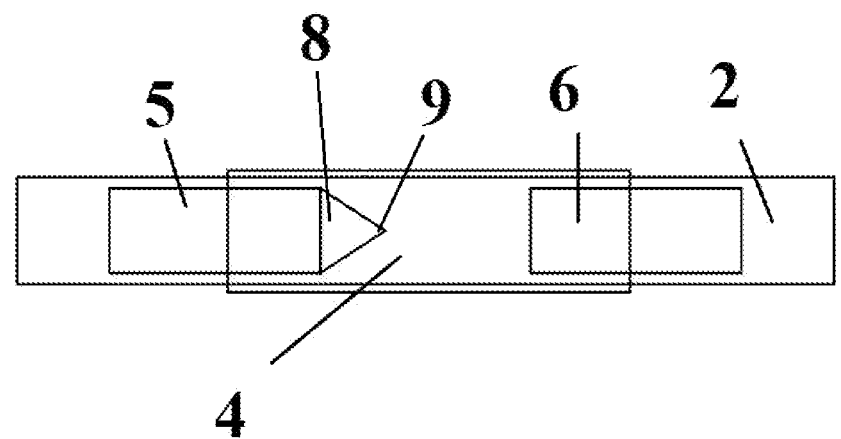
FIG. 2 is a structural diagram of a thin-film transistor according to some embodiments of the disclosure.

FIG. 2 is a structural diagram of a thin-film transistor according to some embodiments of the disclosure. As shown in FIG. 2, the current enhancement portion of the thin-film transistor includes a protrusion portion 8 provided on the drain 5 and facing the source 6, and the protrusion portion 8 includes one tip 9.

Since the protrusion portion 8 has a strong accumulation effect on charges, the thin-film transistor will have larger passing current with the same breadth length ratio. Therefore, when the thin-film transistor in these embodiments is employed, larger passing current can be provided using smaller occupied space, and the occupied space of the thin-film transistor may be reduced. In this way, when the thin-film transistor is applied to the display region, the aperture ratio of the pixel unit can be improved. When the thin-film transistor is applied to the non-display region, the frame region of the display device can be reduced. The tip 9 can further improve the ability of accumulating of the charges, thereby further reducing the occupied space, further improving the aperture ratio or reducing the frame region of the display device.

Those skilled in the art can clearly understand that, in some embodiments, the current enhancement portion of the thin-film transistor includes a protrusion portion provided on the source 6 and facing the drain 5, and the protrusion portion includes one tip. In some embodiments, the current enhancement portion of the thin-film transistor includes a protrusion portion on the source 6 and facing the drain 5 and a protrusion portion on the drain 5 and facing the source 6, and each of the protrusion portions includes one tip.

Figure 3:
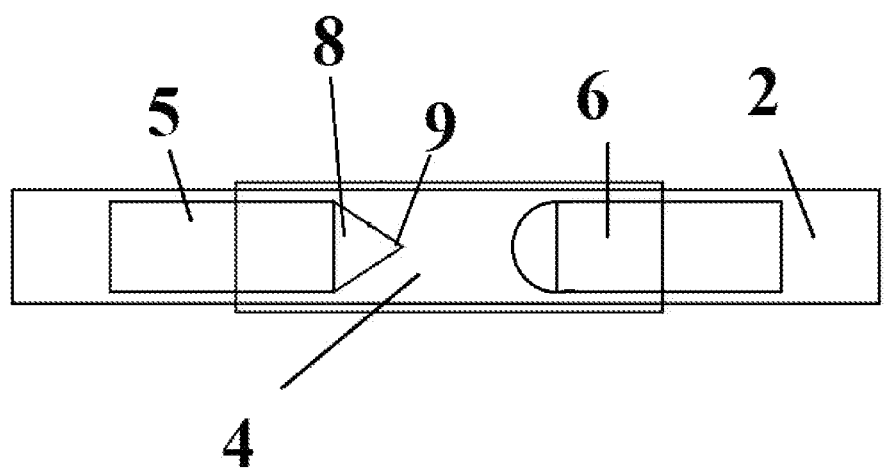
FIG. 3 is a structural diagram of a thin-film transistor according to some embodiments of the disclosure.

FIG. 3 is a structural diagram of a thin-film transistor of some embodiments of the disclosure. As shown in FIG. 3, the current enhancement portion of the thin-film transistor includes a protrusion portion 8 provided at the drain 5 and a protrusion portion 8 provided at the source 6, and the protrusion portion 8 at the drain 5 may include one tip 9.

In FIGS. 2 and 3, the protrusion portion 8 and the tip 9 are shown as a whole, but this is not a limitation on the shape of the protrusion portion 8 and the tip 9. The protrusion portion 8 may have a shape such as a trapezoid, a triangle, a semi-circle and so on. For example, as shown in FIG. 3, the protrusion portion 8 on the source 6 is semi-circle shaped. In a case where the tip 9 is provided on the protrusion portion 8, the protrusion portion 8 may also be rectangular. As long as a protrusion can be formed on the ends of the drain 5 or the source 6, an effect of improving the charge accumulation ability can be achieved.

In addition, the number of the tip 9 is not limited. A plurality of tips 9 may be provided on at least one of the protrusion portion 8 of the drain 5 and the protrusion portion 8 of the source 6. The number of the tips 9 is not limited. The increase in the number of the tips 9 can guarantee that the thin-film transistor has a more stable performance.

Figure 4:
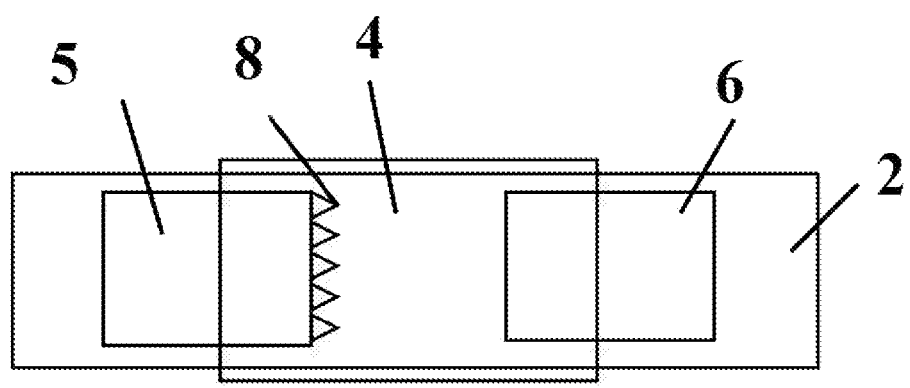
FIG. 4 is a structural diagram of a thin-film transistor according to some embodiments of the disclosure.

FIG. 4 is a structural diagram of a thin-film transistor of some embodiments of the disclosure. As shown in FIG. 4, an array of protrusion portions 8 facing a channel (the portion between the drain 5 and the source 6) are provided on the drain 5, and the protrusion portions 8 include tips 9. In some embodiments, an array of protrusion portions 8 facing a channel (the portion between the drain 5 and the source 6) are provided on the source 6 and the protrusion portions 8 include tips 9, which is not shown.

Figure 5:
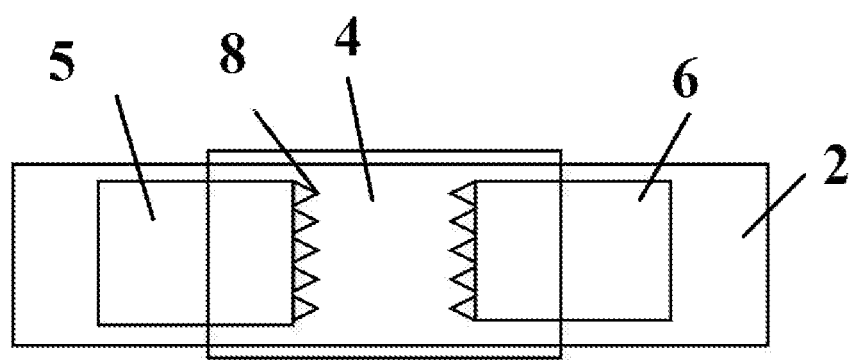
FIG. 5 is a structural diagram of a thin-film transistor according to some embodiments of the disclosure.

FIG. 5 is a structural diagram of a thin-film transistor of some embodiments of the disclosure. As shown in FIG. 5, an array of protrusion portions 8 facing the channel are provided on both the drain 5 and the drain 6.

In some embodiments of the disclosure, the current enhancement portion may include an island portion provided between the drain 5 and the source 6, and the island portion is separate from the drain 5 and the source 6. The island portion is located between the drain 5 and the source 6, and can accumulate charges.

The island portion may further include at least one protrusion end, and the at least one protrusion end faces at least one of the drain 5 and the source 6. Even if no protrusion portion 8 is provided on the source 5 and the drain 6, the island portion 10 can also improve the ability of accumulating charges. The protrusion end can further improve the ability of accumulating charges, thereby further reducing the occupied space, further improving the aperture ratio or reducing the frame region of the display device. The protrusion end may be a tip.

Figure 6:
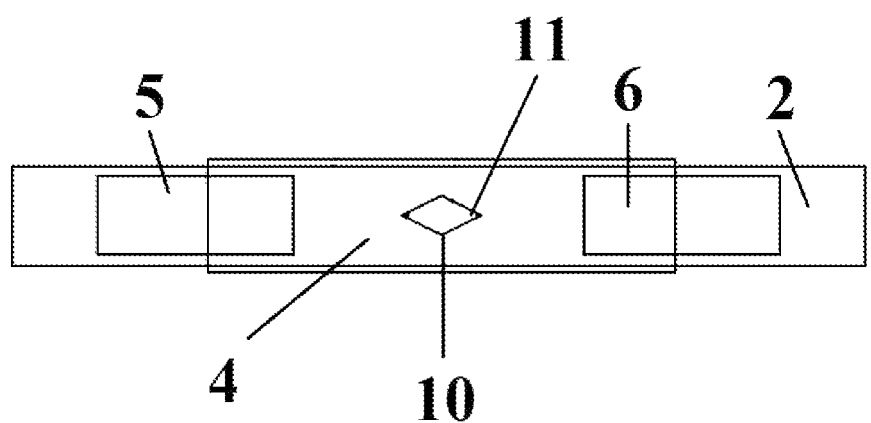
FIG. 6 is a structural diagram of a thin-film transistor according to some embodiments of the disclosure.

FIG. 6 is a structural diagram of a thin-film transistor according to some embodiments of the disclosure. As shown in FIG. 6, in this example, the current enhancement portion of the thin-film transistor further includes an island portion 10 provided between the drain 5 and the source 6, and the island portion 10 is separate from the drain 5 and the source 6. The island portion 10 includes two protrusion ends 11 facing the drain 5 and the source 6 respectively. The protrusion ends 11 are tips.

As shown in FIG. 6, the island portion 10 including the protrusion ends 11 may be integrally formed as a prism with tips, but the island portion 10 may also be other shapes with or without tips. Providing the island portion 10 in the channel may improve the current when the thin-film transistor is turned on.

Figure 7:
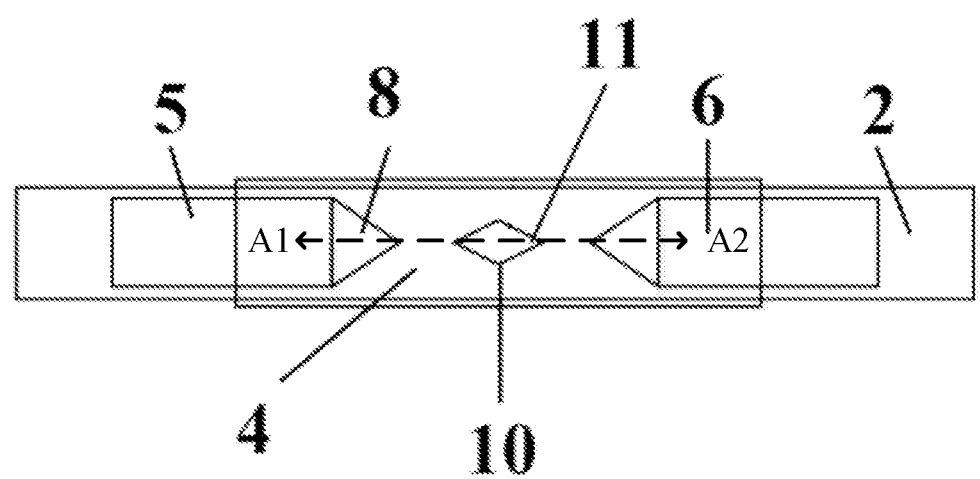
FIG. 7 is a structural diagram of a thin-film transistor according to some embodiments of the disclosure.
Figure 8:
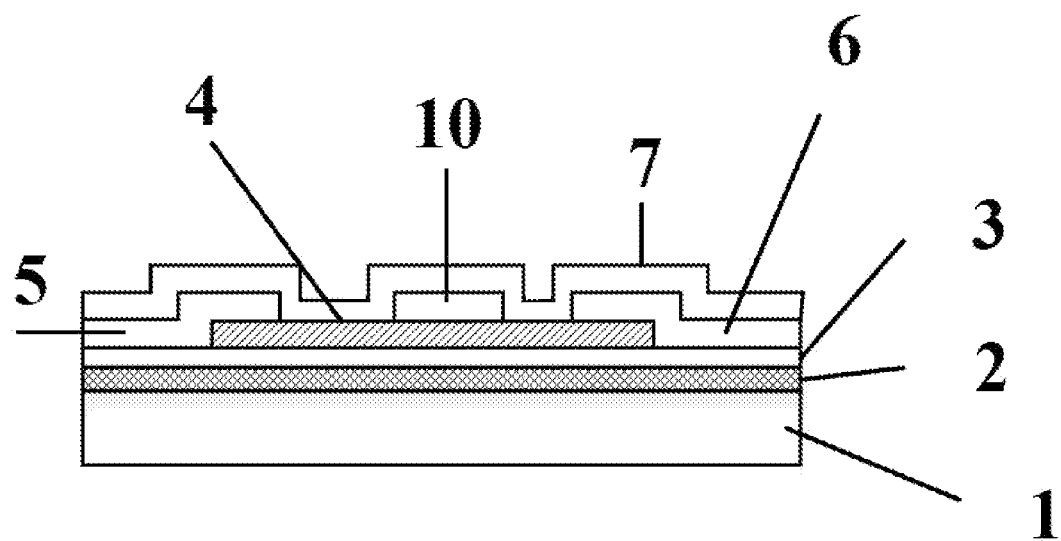
FIG. 8 is a diagram of a layered structure of a cross section A1-A2 of the thin-film transistor shown in FIG. 7.

FIG. 7 is a structural diagram a thin-film transistor of some embodiments of the disclosure. FIG. 8 is a diagram of a layered structure of a cross section A1-A2 of the thin-film transistor shown in FIG. 7. As shown in FIGS. 7 and 8, the current enhancement portion of the thin-film transistor includes an island portion 10 provided between the drain 5 and the source 6, and the island portion 10 is separate from the drain 5 and the source 6. The island portion 10 includes two protrusion ends 11 which face the drain 5 and the source 6 respectively. The protrusion ends 11 are tips. The current enhancement portion of the thin-film transistor also includes a protrusion portion 8 provided at the drain 5 and a protrusion portion 8 provided at the source 6, and each of the protrusion portions 8 includes one tip 9.

Figure 9:
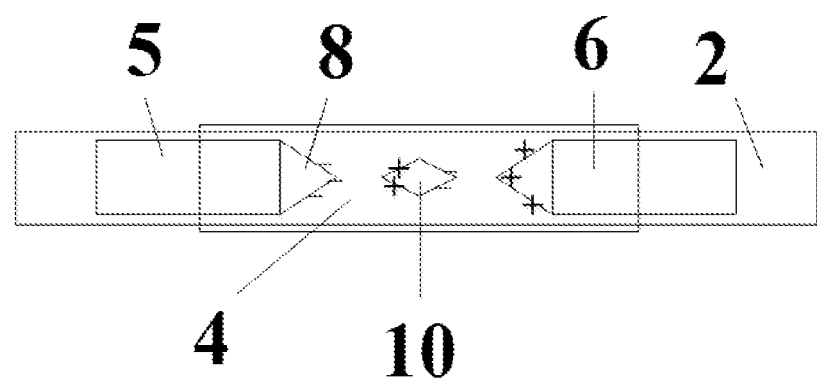
FIG. 9 is a diagram of charge distribution when the thin-film transistor shown in FIG. 7 works.

FIG. 9 is a diagram of charge distribution when the thin-film transistor shown in FIG. 7 works. As shown in FIG. 9, the current flows from the source 6 to the drain 5. A large number of positive charges are accumulated at the tip 9 of the protrusion portion 8 on the source 6 to which a comparatively high voltage is applied. Because of inter-attraction of positive charges and negative charges, a large number of negative charges are accumulated on the protrusion end 11 of the island portion 10 facing the source 6, such that positive charges are accumulated on the protrusion end 11 of the island portion 10 of the pointed island facing the drain 5, while negative charges are accumulated at the tip 9 of the protrusion portion 8 on the drain 5. In the case of applying the same voltage to the source 6, in the thin-film transistor of this example, since a large number of charges are accumulated at respective tips 9 and protrusion ends 11, it can be guaranteed that bigger current flows when the thin-film transistor is in the ON state. The island portion 10 can increase the breadth length ratio of the channel, improve the ability of passing the current, and in the case of having protrusion ends 11, can further increase the current between the drain 5 and the source 6.

In the embodiments described above, the protrusion portion 8 provided at the drain 5 and the protrusion portion 8 provided at the source 6, or the protrusion portion 8 and the protrusion end 11 of the island portion 10, may be for example correspondingly arranged in a one-to-one corresponding way, and may also not be correspondingly arranged, both of which may achieve the effect of increasing the current.

Those skilled can also understand that any arrangement of the protrusion portion as described above can be applied in combination with any arrangement of the island as described above.

Figure 10:
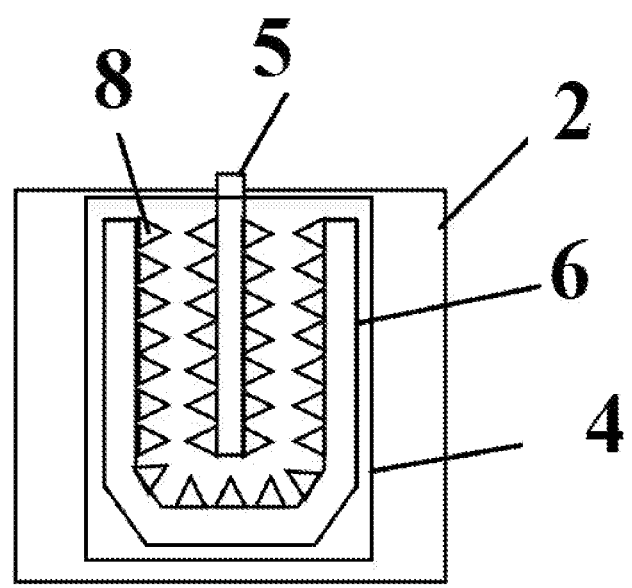
FIG. 10 is a structural diagram of a thin-film transistor of a U shape channel according to some embodiments of the disclosure.

FIG. 10 is a structural diagram of a thin-film transistor of a U shape channel of some embodiments of the disclosure. As shown in FIG. 10, the current enhancement portion of the thin-film transistor includes an array of protrusion portions 8 provided at the drain 5 facing the channel and an array of protrusion portions 8 provided at the source 6 facing the channel. In the context of the thin-film transistor of the U shape channel, the existence of the current enhancement portion can increase the breadth length ratio of the channel more directly and more effectively, thereby enhancing the ability of passing the current.

In some embodiments of the disclosure, the current enhancement portion may be made of a metal material which is the same as the drain 5 and the source 6. For basic purposes of the disclosure, as long as internal positive and negative charges can move and accumulate at different surfaces or ends when the current enhancement portion is influenced by the electric field, it is possible to achieve accumulation of charges and increase the ON current of the thin-film transistor. However, as viewed from simplification of the manufacturing process of the thin-film transistor, it is more convenient for the current enhancement portion to be made of the same metal material as the drain 5 and the source 6. As such, the protrusion portion 8 and/or the island portion 10 can be formed as reserved patterns directly when forming the patterns of the drain 5 and the source 6. As such, it is not necessary to adjust the related manufacturing process of the thin-film transistor, and there is no increase in the production cost.

Some embodiments of the disclosure further provide an array substrate which includes the thin-film transistor as described above. In some embodiments of the disclosure, the thin-film transistor may be included in a display region of the array substrate. In some embodiments of the disclosure, the thin-film transistor may also be included in a non-display region of the array substrate.

In this way, including the thin-film transistor as described above in the pixel unit of the display region can improve the aperture ratio of the pixel unit. Including the thin-film transistor as described above in a circuit, such as an anti-electrostatic circuit, in the non-display region can reduce the frame region.

Some embodiments of the disclosure further provide a display panel which includes the array substrate as described above.

Some embodiments of the disclosure further provide a display device which includes the display panel as described above. The display device may be any product or component having a display function, such as a liquid crystal panel, electronic paper, an OLED panel, a cellphone, a tablet computer, a TV set, a display, a notebook computer, a digital photo frame, a navigator and so on.

It may be understood that the above embodiments are only exemplary embodiments adopted to explain the principles of the disclosure, but the disclosure is not limited thereto. For those ordinary skilled in the art, various variations and improvements may be made without departing from the spirits and nature of the disclosure, which are also considered to be within the protection scope of the disclosure.

What is claimed is:

1. A thin-film transistor comprising:
   a gate,
   a gate insulation layer on the gate,
   an active layer on the gate insulation layer,
   a drain partly on the active layer,
   a source partly on the active layer,
   an island portion provided between the drain and the source on the active layer and separate from the drain and the source, and
   at least one protrusion portion provided on at least one of the drain or the source on the active layer and facing the island portion.

2. The thin-film transistor according to claim 1, wherein the island portion includes at least one protrusion end, and the at least one protrusion end faces at least one of the drain or the source.

3. The thin-film transistor according to claim 2, wherein the at least one protrusion end and the at least one protrusion portion are arranged correspondingly.

4. The thin-film transistor according to claim 2, wherein the at least one protrusion end is a tip.

5. The thin-film transistor according to claim 3, wherein the island portion and the at least one protrusion portion are made of a metal material which is the same as that of the drain and the source.

6. An array substrate comprising a display region and a non-display region, wherein at least one of the display region and/or the non-display region include the thin-film transistor according to claim 1.

7. The thin-film transistor according to claim 6, wherein the island portion includes at least one protrusion end, and the at least one protrusion end faces at least one of the drain or the source.

8. The thin-film transistor according to claim 7, wherein the at least one protrusion end and the at least one protrusion portion are arranged correspondingly.

9. The thin-film transistor according to claim 7, wherein the protrusion end is a tip.

10. A display panel that includes the array substrate according to claim 6.

11. A display device that includes the display panel according to claim 7.

* * * * *